United States Patent
Zhang

(10) Patent No.: US 8,563,986 B2
(45) Date of Patent: Oct. 22, 2013

(54) POWER SEMICONDUCTOR DEVICES HAVING SELECTIVELY DOPED JFET REGIONS AND RELATED METHODS OF FORMING SUCH DEVICES

(75) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 762 days.

(21) Appl. No.: 12/611,165

(22) Filed: Nov. 3, 2009

(65) Prior Publication Data
US 2011/0101375 A1    May 5, 2011

(51) Int. Cl.
*H01L 27/06*   (2006.01)
*H01L 29/24*   (2006.01)
*H01L 21/8248* (2006.01)

(52) U.S. Cl.
USPC ...... 257/77; 257/121; 257/124; 257/E27.105; 257/E29.104

(58) Field of Classification Search
USPC ............ 257/77, 121, 124, 134, E27.105, 257/E29.104
See application file for complete search history.

(56) References Cited

U.S. PATENT DOCUMENTS

| | | | |
|---|---|---|---|
| 5,969,378 A | 10/1999 | Singh | |
| 6,121,633 A | 9/2000 | Singh et al. | |
| 2002/0164843 A1 | 11/2002 | Yamazaki | |
| 2003/0057478 A1* | 3/2003 | Yun et al. | 257/328 |
| 2005/0116284 A1* | 6/2005 | Chen | 257/329 |
| 2008/0105949 A1* | 5/2008 | Zhang et al. | 257/584 |
| 2008/0296771 A1* | 12/2008 | Das et al. | 257/758 |

OTHER PUBLICATIONS

J. T. Richmond, S. Ryu, A.K. Agarwal and J.W. Palmour, "Hybrid 4H-SiC MOS Gated Transistor (MGT)".
International Preliminary Report On Patentability Corresponding To International Application No. PCT/US2010/053100; Date of Mailing: May 18, 2012; 10 Pages.
Notifcation of Transmittal of the International Search Report and the Written Opinion of the International Searching Authority, or the Declaration; International Search Report; Written Opinion of the International Searching Authority corresponding to International Application No. PCT/US2010/053100; Date of Mailing: Dec. 14, 2010; 12 pages.

* cited by examiner

*Primary Examiner* — Lynne Gurley
*Assistant Examiner* — Vernon P Webb
(74) *Attorney, Agent, or Firm* — Myers Bigel Sibley & Sajovec

(57) ABSTRACT

Semiconductor switching devices include a wide band-gap drift layer having a first conductivity type (e.g., n-type), and first and second wide band-gap well regions having a second conductivity type (e.g., p-type) on the wide band-gap drift layer. First and second wide band-gap source/drain regions of the first conductivity type are on the first and second wide band-gap well regions, respectively. A wide band-gap JFET region having the first conductivity type is provided between the first and second well regions. This JFET region includes a first local JFET region that is adjacent a side surface of the first well region and a second local JFET region that is adjacent a side surface of the second well region. The local JFET regions have doping concentrations that exceed a doping concentration of a central portion of the JFET region that is between the first and second local JFET regions of the JFET region.

20 Claims, 8 Drawing Sheets

POWER SEMICONDUCTOR DEVICES HAVING SELECTIVELY DOPED JFET REGIONS AND RELATED METHODS OF FORMING SUCH DEVICES

FIELD OF THE INVENTION

The present invention relates to semiconductor devices and, more particularly, to semiconductor devices that have JFET regions.

BACKGROUND

Power Metal Oxide Semiconductor Field Effect Transistors ("MOSFET") are a well known type of semiconductor transistor that may be used as a switching device in high power applications. A power MOSFET may be turned on or off by applying a gate bias voltage to a gate electrode of the device. When a power MOSFET is turned on (i.e., it is in its "on-state"), current is conducted through a channel of the MOSFET. When the bias voltage is removed from the gate electrode (or reduced below a threshold level), the current ceases to conduct through the channel. By way of example, an n-type MOSFET turns on when a gate bias voltage is applied that is sufficient to create a conductive n-type inversion layer in a p-type channel region of the device. This n-type inversion layer electrically connects the n-type source and drain regions of the MOSFET, thereby allowing for majority carrier conduction therebetween.

The gate electrode of a power MOSFET is separated from the channel region by a thin oxide gate insulating layer. Because the gate of the MOSFET is insulated from the channel region, minimal gate current is required to maintain the MOSFET in its on-state or to switch the MOSFET between its on-state and its off-state. The gate current is kept small during switching because the gate forms a capacitor with the channel region. Thus, only minimal charging and discharging current is required during switching, allowing for less complex gate drive circuitry. Moreover, because MOSFETS are unipolar devices in which current conduction occurs solely through majority carrier transport, MOSFETs may exhibit very high switching speeds. The drift region of a power MOSFET, however, may exhibit a relatively high on-resistance, which arises from the absence of minority carrier injection. This increased resistance can limit the forward current density achievable with power MOSFETs. Additionally, the gate insulating layer of MOSFETs may degrade over time with use of the MOSFET.

The bipolar junction transistor ("BJT") is another well known type of semiconductor transistor that may be used as a switching device in high power applications. As is known to those of skill in the art, a BJT includes two p-n junctions that are formed in close proximity to each other in the semiconductor material. In operation, charge carriers enter a first region of the semiconductor material (which is called the emitter) that is adjacent one of the p-n junctions. Most of the charge carriers exit the device from a second region of the semiconductor material (which is called the collector) that is adjacent the other p-n junction. The collector and emitter are formed in regions of the semiconductor material that have the same conductivity type. A third, relatively thin region of the semiconductor material, known as the base, is positioned between the collector and the emitter and has a conductivity type that is opposite the conductivity type of the collector and the emitter. Thus, the two p-n junctions of the BJT are formed where the collector meets the base and where the base meets the emitter. By flowing a small current through the base of a BJT, a proportionally larger current passes from the emitter to the collector.

BJTs are current controlled devices in that a BJT is turned "on" (i.e., it is biased so that current flows between the emitter and the collector) by flowing a current through the base of the transistor. For example, in an NPN BJT (i.e., a BJT that has n-type collector and emitter regions and a p-type base region), the transistor is typically turned on by applying a positive voltage to the base to forward bias the base-emitter p-n junction. When the device is biased in this manner, holes flow into the base of the transistor where they are injected into the emitter. The holes are referred to as "majority carriers" because the base is a p-type region, and holes are the "normal" charge carriers in such a region. At the same time, electrons are injected from the emitter into the base, where they diffuse toward the collector. These electrons are referred to as "minority carriers" because electrons are not the normal charge carrier in the p-type base region. The device is referred to as a "bipolar" device because the emitter-collector current includes both electron and hole current.

A BJT may require a relatively large base current to maintain the device in its on-state. As such, relatively complex external drive circuits may be required to supply the relatively large base currents that can be required by high power BJTs. Moreover, the switching speeds of BJTs may be significantly slower than the switching speeds of power MOSFETs due to the bipolar nature of the current conduction.

Devices embodying a combination of bipolar current conduction with MOS-controlled current flow are also known. One example of such a device is the Insulated Gate Bipolar Transistor ("IGBT"), which is a device that combines the high impedance gate of the power MOSFET with the small on-state conduction losses of the power BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit. The IGBT may combine the high temperature, high current density switching characteristics of the BJT with the minimal drive requirement of the MOSFET.

Most power semiconductor devices are formed of silicon ("Si"), although a variety of other semiconductor materials have also been used. Silicon carbide ("SiC") is one of these alternate materials. Silicon carbide has potentially advantageous semiconductor characteristics including, for example, a wide band-gap, high electric field breakdown strength, high thermal conductivity, high electron mobility, high melting point and high-saturated electron drift velocity. Thus, relative to devices formed in other semiconductor materials such as, for example, silicon, electronic devices formed in silicon carbide may have the capability of operating at higher temperatures, at high power densities, at higher speeds, at higher power levels and/or under high radiation densities.

SUMMARY

Pursuant to embodiments of the present invention, semiconductor switching devices are provided that include a wide band-gap drift layer having a first conductivity type. These devices further include a first and second wide band-gap well regions that have a second conductivity type on the wide band-gap drift layer. First and second wide band-gap source/drain regions that have the first conductivity type are provided on the first and second wide band-gap well regions, respectively. A wide band-gap JFET region having the first conductivity type is provided between the first and second well regions. A first local JFET region of the JFET region is provided adjacent a side surface of the first well region and a second local JFET region of the JFET region is provided adjacent a side surface of the second well region. The first and second local JFET regions each have a doping concentration that exceeds a doping concentration of a central portion of the JFET region that is between the first and second local JFET regions. In some embodiments, a peak doping concentration of each of the first and second local JFET regions may exceed the doping concentration at the central portion the JFET region by at least a factor of three.

In some embodiments, the first and second local JFET regions may extend at least partially underneath the first and second wide band-gap well regions, respectively. Moreover, the device may also include a gate insulation layer on the wide band-gap JFET region and the first and second wide band-gap well regions. A gate electrode may be provided on the gate insulation layer. In some embodiments, the first local JFET region may extend at least partially underneath the first wide band-gap source/drain region, and the second local JFET region may extend at least partially underneath the second wide band-gap source/drain region.

In some embodiments, the semiconductor switching device may be a silicon carbide MOSFET. In some embodiments where the switching device is a silicon carbide MOSFET, the wide band-gap drift layer may be an n-type silicon carbide drift layer, the first and second wide band-gap well regions may be first and second p-type silicon carbide p-wells, the first and second wide band-gap source/drain regions may be first and second n-type silicon carbide source/drain regions, and the wide band gap JFET region may be an n-type silicon carbide JFET region.

In other embodiments, the semiconductor switching device may be a silicon carbide insulated gate bipolar junction transistor ("IGBT"). In some embodiments where the switching device is a silicon carbide IGBT, the device may include an n-type silicon carbide substrate and first and second n+ silicon carbide emitter regions that are formed in the first and second wide band-gap well regions, respectively. In such embodiments, the wide band-gap drift layer may be a p-type silicon carbide drift layer, the first and second wide band-gap well regions may be first and second n-type silicon carbide n-wells, the first and second wide band-gap source/drain regions may be first and second p-type silicon carbide source/drain regions, and the wide band gap JFET region may be a p-type silicon carbide JFET region.

Pursuant to further embodiments of the present invention, IGBTs are provided that include a wide band-gap drift layer having a first conductivity type on a wide band-gap substrate having a second conductivity type. First and second wide band-gap well regions that have the second conductivity type are provided on the wide band-gap drift layer. First and second wide band-gap source/drain regions that have the first conductivity type are provided on the first and second wide band-gap well regions, respectively. First and second wide band-gap collector regions having the second conductivity type are provided on the first and second wide band-gap well regions, respectively. A wide band-gap JFET region having the first conductivity type is provided between the first and second well regions. This JFET region includes first and second local JFET regions that are adjacent the respective side surfaces of the first and second well regions. These local JFET regions have doping concentrations that exceed a doping concentration of the central portion of the JFET region that is between the first and second local JFET regions of the JFET regions.

In some embodiments, the first and second local JFET regions extend at least partially underneath the first and second wide band-gap well regions, respectively. These IGBTs may also include a gate insulation layer on the JFET region and the first and second wide band-gap well regions, and a gate electrode on the gate insulation layer. The first and second local JFET regions also extend at least partially underneath the first and second wide band-gap source/drain regions, respectively.

Pursuant to still further embodiments of the present invention, methods of forming a power field effect transistor are provided in which a first wide band-gap layer having a first conductivity type is formed. A mask layer is formed on a top surface of the first wide band-gap layer, the mask layer having first and second openings therein. First and second heavily-doped source/drain regions are formed in an upper portion of the first wide band-gap layer through the first and second openings in the mask layer. A portion of the mask layer may then be removed. First and second wide band-gap well regions having a second conductivity type are formed in the first and second wide band-gap layers, respectively, such that the first the and second heavily-doped source/drain regions are within the first and second wide band-gap well regions, respectively. First and second local JFET regions having the first conductivity type are formed adjacent side edges of the first and second wide band-gap well regions, respectively. The first and second local JFET regions are separated by a wide band-gap JFET region having the first conductivity type, and the first and second local JFET regions each have a doping concentration that exceeds a doping concentration of the wide band-gap JFET region therebetween.

In some embodiments, the first wide band-gap layer comprises a wide band-gap drift layer. In other embodiments, the first wide band-gap layer comprises a wide band-gap current spreading layer that is formed on a wide band-gap drift layer. The first wide band-gap well region may be formed having the second conductivity type in the wide band-gap drift layer such that the first heavily-doped source/drain region is within the first wide band-gap well region by implanting ions of the second conductivity type into the wide band-gap drift layer at a concentration that forms the first wide band-gap well region but that is insufficient to substantially change the doping concentration of the first heavily-doped source/drain region that is within the first wide band-gap well region. The first and second local JFET regions may be formed by implanting dopants of the first conductivity type into an exposed area of the substrate that includes the first and second wide band-gap well regions and the first and second heavily-doped source/drain regions after formation of the first and second wide band-gap well regions so that the first and second local JFET regions have a higher doping concentration than does the remainder of the JFET region. Moreover, the first and second local JFET regions may extend closer to a bottom surface of the wide band-gap drift layer than do the first and second wide band-gap well regions.

DETAILED DESCRIPTION

Figure 1:
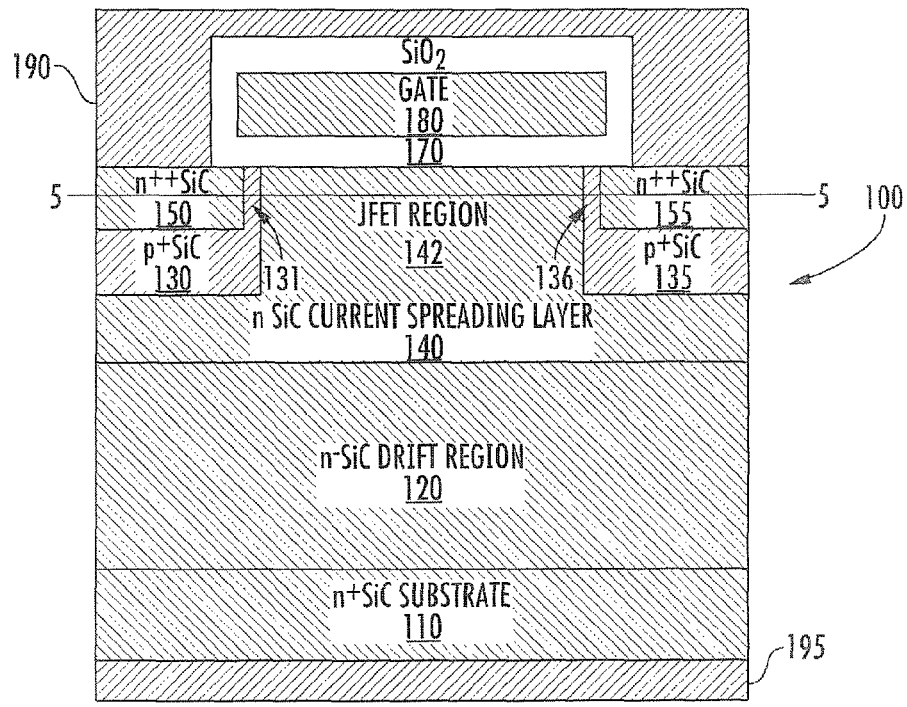
FIG. 1 is a schematic cross-sectional diagram of a conventional power MOSFET.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a" "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

As used herein, source and drain regions may be generically referred to as "source/drain regions," which is a term used to refer to either a source region or a drain region.

It will be understood that the embodiments disclosed herein can be combined. Thus, features that are pictured and/or described with respect to a first embodiment may likewise be included in a second embodiment, and vice versa.

Power MOSFETs and IGBTs are in use today for applications requiring high voltage blocking such as voltage blocking of 5,000 volts or more. By way of example, silicon carbide MOSFETs are commercially available that are rated for current densities of 10 A/cm$^2$ or more that will block voltages of at least 10 kV. To form such a high power silicon carbide MOSFET, a plurality of "unit cells" are typically formed, where each unit cell typically comprises two adjacent MOSFETs that have a common gate electrode, separate source regions and a common drain region. In high power applications, a large number of these unit cells are typically provided on a single semiconductor substrate, and a common gate electrode is typically formed on a top side of the semiconductor substrate that acts as the gate electrode for all of the unit cells. The opposite (bottom) side of the semiconductor substrate acts as a common drain (or source) for all of the units cells of the device. A plurality of source (or drain) regions are interposed within openings in the gate electrode. These source regions are also electrically connected to each other to serve as a common source. Herein, embodiments of the present invention are typically described with respect to cross-sectional diagrams that show a single unit cell of a power MOSFET. It will thus be appreciated that actual implementations will typically include a large number of unit cells. However, it will also be appreciated that the present invention is not limited to such devices, and that the claims appended hereto also cover MOSFETs and other power switching devices that comprise a single unit cell or even a single MOSFET transistor. Moreover, while the present disclosure focuses on silicon carbide devices, it will be appreciated that embodiments of the present invention may also have applicability to devices formed using other wide band gap semiconductors. Herein, the term "wide band-gap" refers to semiconductors having a band-gap of at least 1.4 eV.

FIG. 1 is a schematic cross-sectional diagram of a unit cell of a conventional power MOSFET 100 that includes two individual MOSFET transistors. As shown in FIG. 1, the MOSFET 100 may be implemented on a heavily-doped (n$^+$) single crystal n-type silicon carbide substrate 110. A lightly-doped (n$^-$) silicon carbide drift layer 120 is provided on the substrate 110. An n-type silicon carbide current spreading layer 140 is provided on the n$^-$ silicon carbide drift layer 120. The current spreading layer 140 may be formed, for example, by epitaxial growth after formation of then silicon carbide drift layer 120 in order to provide a moderately-doped (n) current spreading layer 140 that has a doping concentration that exceeds the doping concentration of the more lightly-doped n$^-$ silicon carbide drift layer 120. The current spreading layer 140 may then be selectively etched for formation of first and second spaced apart p-type silicon carbide wells 130, 135 ("p-wells") that are provided in an upper surface of the n-type current spreading layer 140. Alternatively, the p-wells 130, 135 may be formed by an ion implantation process. All or part of each p-well 130, 135 may be heavily doped (p$^+$). Herein, the portion of the current spreading layer 140 that is between adjacent p-wells (or n-wells) of a device is referred to as the JFET region 142 of the device. First and second heavily-doped (n$^+$) n-type silicon carbide regions 150, 155 are provided within the respective first and second p-wells 130, 135. It will also be appreciated that the current spreading layer 140 may be omitted such that the p-wells 130, 135 are formed in an upper portion of the drift layer 120. In such devices, the JFET region 142 typically is formed by ion implantation to provide a JFET region 142 between the p-wells 130, 135 that has a higher doping concentration than the remainder of the drift layer 120.

The first and second heavily-doped (n$^+$) n-type silicon carbide regions 150, 155 act as the source regions for the two individual transistors of MOSFET 100, while the current spreading layer 140 acts as a common drain region for the MOSFET 100. A channel region 131 is provided in the p-well 130 between the source region 150 and the JFET region 142, and a channel region 136 is provided in the p-well 135 between the source region 155 and the JFET region 142. A gate insulating layer 170 is provided on the JFET region 142, portions of the p-wells 130, 135 and portions of the n-type silicon carbide regions 150, 155. A gate electrode 180 is provided on the gate insulating layer 170. The gate electrode 180 may comprise, for example, a doped polysilicon or silicon carbide layer, and the insulating layer 170 may comprise, for example, silicon dioxide. As shown in FIG. 1, the gate insulating layer 170 may surround the gate electrode 180.

An ohmic contact 190 (e.g., a metal layer) on the n$^+$ source regions 150, 155 acts as a common source contact, and an ohmic contact 195 on the back side of the n$^+$ silicon carbide substrate 100 acts as the drain contact of the MOSFET 100.

As should be clear from the above discussion, in conventional silicon carbide MOSFETs, the JFET region 142 between the p-wells 130, 135 is doped more heavily than the underlying drift layer 120. This higher doping concentration is provided to reduce the resistance of the JFET region 142 in order to increase the current densities that are supported by the device 100. Unfortunately, the higher doping concentration in the JFET region 142 increases the electrical field of the MOSFET 100 when the MOSFET 100 is in its off-state. This increased electrical field can damage the gate insulation layer 170 and/or decrease manufacturing yields. The increased doping concentration in the JFET region 142 can also act to reduce the voltage blocking capability of some devices such as, for example, power IGBTs.

Pursuant to embodiments of the present invention, power switching devices such as power MOSFETs and IGBTs are provided that include selectively doped JFET regions. In particular, in some embodiments, the JFET regions may include first and second peripheral portions that are adjacent the wells that are more highly-doped than is the central portion of the JFET region. Herein, these more highly-doped peripheral portions of the JFET region are sometimes referred to as "local JFET regions." In some embodiments, the local JFET regions may be formed by implanting dopants into the outer portions of the JFET region that are adjacent the wells, while the center portion of the JFET region is not implanted. By selectively implanting the JFET region, it may be possible to, for example, reduce the electrical field in the gate oxide layer when the device is in its off-state due to the lower doping concentration provided in the center portion of the JFET region.

The power MOSFETs, IGBTs and other devices according to embodiments of the present invention may exhibit a number of advantages as compared to conventional power devices. For example, as noted above, the power MOSFET and IGBTs according to embodiments of the present invention may exhibit lower electric field levels in the gate oxide layer when the MOSFET or IGBT is in its off-state. As a result, the gate oxide layers of devices according to embodiments of the present invention may experience less stress as compared to conventional power devices, and thus may have improved device stability. As the gate oxide may undergo less stress during device operation, the standard for qualifying a device may be lowered, which may result in improved device manufacturing yield. Additionally, when the devices according to embodiments of the present invention are in their off-states, the depletion regions of the transistors on opposite sides of the JFET region may tend to merge under the JFET region at a deeper depth within the device layer structure as measured from the gate electrode as compared to conventional devices. As a result, the devices according to embodiments of the present invention may exhibit reduced reverse leakage current. The merging of these depletion regions may also provide enhanced voltage blocking capabilities as compared to conventional devices that have shallower depletion regions in the JFET region of the device.

Furthermore, with conventional IGBTs having a current spreading layer that is doped via ion implantation, an inherent tradeoff may exist between the switching speed of the device and the forward voltage drop ($V_F$) required to turn the device on. In particular, the ion implantation causes damage to the crystal which reduces the carrier lifetime, and the damaged regions may trap carriers and allow them to recombine. As a result, the ion implantation may enhance the switching speed of the device, but does so at what can be a significant increase in the forward voltage drop that is required to turn the device on. In many applications, the negative consequences of this increase in forward voltage drop may outweigh any advantages provided by the improved switching speed. As the IGBTs according to embodiments of the present invention may only partially implant the JFET region, typically less ion implantation damage will result. For many applications, this may provide a better trade-off between forward voltage drop and switching speed than is provided with conventional IGBTs.

Additionally, IGBTs according to embodiments of the present invention may also provide a non-destructive avalanche current path within an active area of the device. As known to those of skill in the art, "avalanche breakdown" (which is sometimes simply referred to as "avalanche") in a BJT refers to a rapid current multiplication that can occur when a strong electric field is applied to the device. In power SiC BJTs (and hence in SiC IGBTs), much of this avalanche current will typically flow through a termination region of the device that surrounds the active area. Unfortunately, the termination regions of such devices typically cannot handle avalanche current levels, and thus if avalanche breakdown occurs, the device may be permanently destroyed. The power IGBTs according to some embodiments of the present invention may have local JFET regions that extend at least partially under the well region of the device, which may make it easier for avalanche currents to flow through the active area of the device, as the increased doping level under the well results in an increased electric field at the p-n junction under the well, which facilitates avalanche conditions being reached. As a result, IGBTs according to embodiments of the present invention may include leakage current paths within the active area of the device that carry the avalanche current when the device breaks down. When the avalanche current is carried through these leakage current paths it may not destroy the device, and hence the IGBTs according to certain embodiments of the present invention may be more likely to survive avalanche events.

Figure 2:
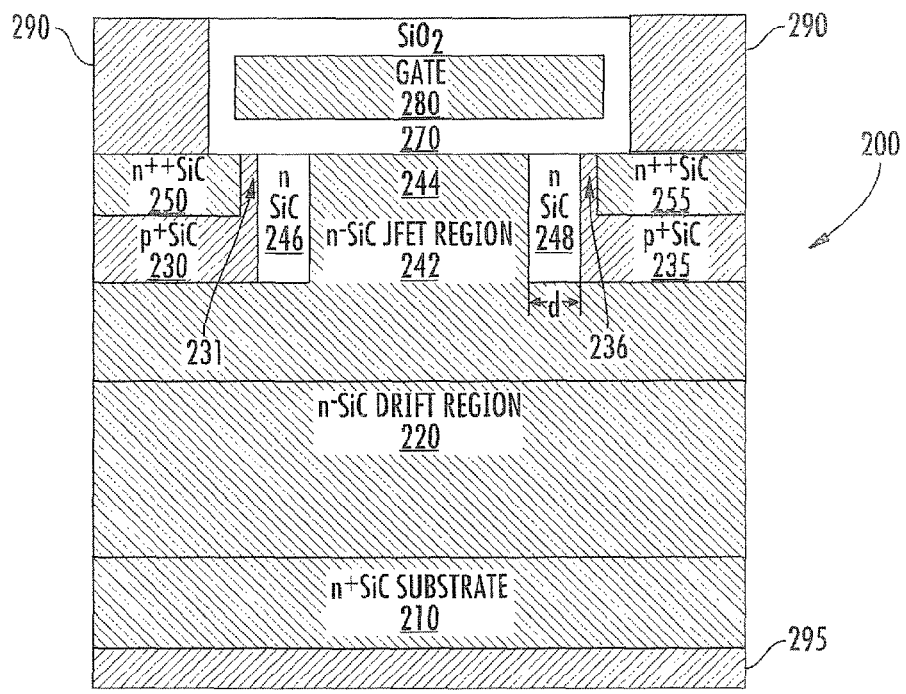
FIG. 2 is a schematic cross-sectional diagram of a power MOSFET according to embodiments of the present invention.

FIG. 2 is a schematic cross-sectional diagram of a power MOSFET 200 according to certain embodiments of the present invention. The MOSFET 200 may be implemented as a monolithic device on, for example, a heavily-doped bulk single crystal s-type silicon carbide substrate 210. It will be appreciated, however, that, in some embodiments, the substrate 210 may be removed after the device is formed, or may be omitted altogether. It will also be appreciated that herein the term "substrate" may encompass a semiconductor layer such as, for example, a semiconductor layer that is epitaxially grown or otherwise formed on a semiconductor or non-semiconductor substrate.

A lightly-doped (n$^-$) n-type silicon carbide drift layer 220 is provided on the substrate 210. Then silicon carbide drift layer 220 may be formed, for example, by epitaxial growth. First and second spaced apart p-type silicon carbide p-wells 230, 235 are provided in an upper surface of the n$^-$ drift layer 220. All or part of each p-well 230, 235 may be heavily doped (p$^+$). An n-type silicon carbide JFET region 242 is provided on the n$^-$ silicon carbide drift layer 220 between the p-wells 230, 235. The JFET region 242 includes a central portion 244 and two local JFET regions 246, 248 that are adjacent to the respective p-wells 230, 235.

The local JFET regions 246, 248 of the JFET region 242 may have a first doping concentration that is greater than a second doping concentration of the central portion 244 of the JFET region 242. By way of example, in some embodiments, the doping concentration of the local JFET regions 246, 248 may exceed the doping concentration of the central portion 244 of the JFET region 242 by at least about a factor of three. In some embodiments, the doping concentration of the local JFET regions 246, 248 may exceed the doping concentration of the central portion 244 of the JFET region 242 by between about a factor of five and a factor of fifteen. As will be discussed in greater detail below, in some embodiments, the n-type silicon carbide JFET region 242 may be formed by epitaxially growing a thick n$^-$ silicon carbide drift layer 220, and then selectively etching this layer to form a pair of recesses for the p-wells 230, 235. The p-wells 230, 235 may then be selectively grown in these recesses. The local JFET regions 246, 248 may then be formed by, for example, using selective ion implantation to further dope the portions of the JFET region 242 that are adjacent the p-wells 230, 235. In this manner, a JFET region 242 having a lightly doped central portion 244 and moderately-doped local JFET regions 246, 248 may be provided.

First and second heavily-doped (n$^+$) n-type silicon carbide regions 250, 255 are formed within the respective first and second p-wells 230, 235 by, for example, selective epitaxial growth (this may be done either before or after formation of the local JFET regions 246, 248). All of the layers/regions 210, 220, 230, 235, 242, 250, 255 may comprise 4H—SiC layers/regions. The first and second heavily-doped (n$^+$) n-type silicon carbide regions 250, 255 act as source regions of the MOSFET 200, while the n$^-$ drift layer 220 acts as a common drain region for the MOSFET 200. A channel region 231 is provided in the p-well 230 between the source region 250 and the common drain region 220, and a channel region 236 is provided in the p-well 235 between the source region 255 and the common drain region 220. A gate insulating layer 270 is provided on the JFET region 242, portions of the p-wells 230, 235 and portions of the n$^+$ silicon carbide regions 250, 255. A gate electrode 280 is provided on the gate insulating layer 270. The gate electrode 280 may comprise, for example, a doped polysilicon or silicon carbide layer, and the gate insulating layer 270 may comprise, for example, silicon dioxide. As shown in FIG. 2, in some embodiments, the gate insulating layer 270 may surround the gate electrode 280.

Ohmic contacts 290 (e.g., metal) are formed on the n$^+$ source regions 250, 255 to provide source contacts. In some embodiments, a single metal layer may be used to provide the ohmic contact 290 for both individual MOSFETs. An ohmic contact 295 is formed on the back side of the n$^+$ silicon carbide substrate 200 that acts as the drain contact of the MOSFET 200.

With regard to the carrier concentrations, the p$^+$ and n$^+$ conductivity type regions and epitaxial layers described above may be as heavily doped as possible without causing excessive fabrication defects. Suitable dopants for producing the p-type silicon carbide regions include aluminum, boron or gallium. Suitable dopants for producing the n-type silicon carbide regions include nitrogen and phosphorus.

As shown in FIG. 2, in some embodiments, the local JFET regions 246, 248 may have a depth from the top surface of the device (i.e., the surface opposite the substrate) that is approximately the same as the depth of the p-wells 230, 235.

Figure 3:
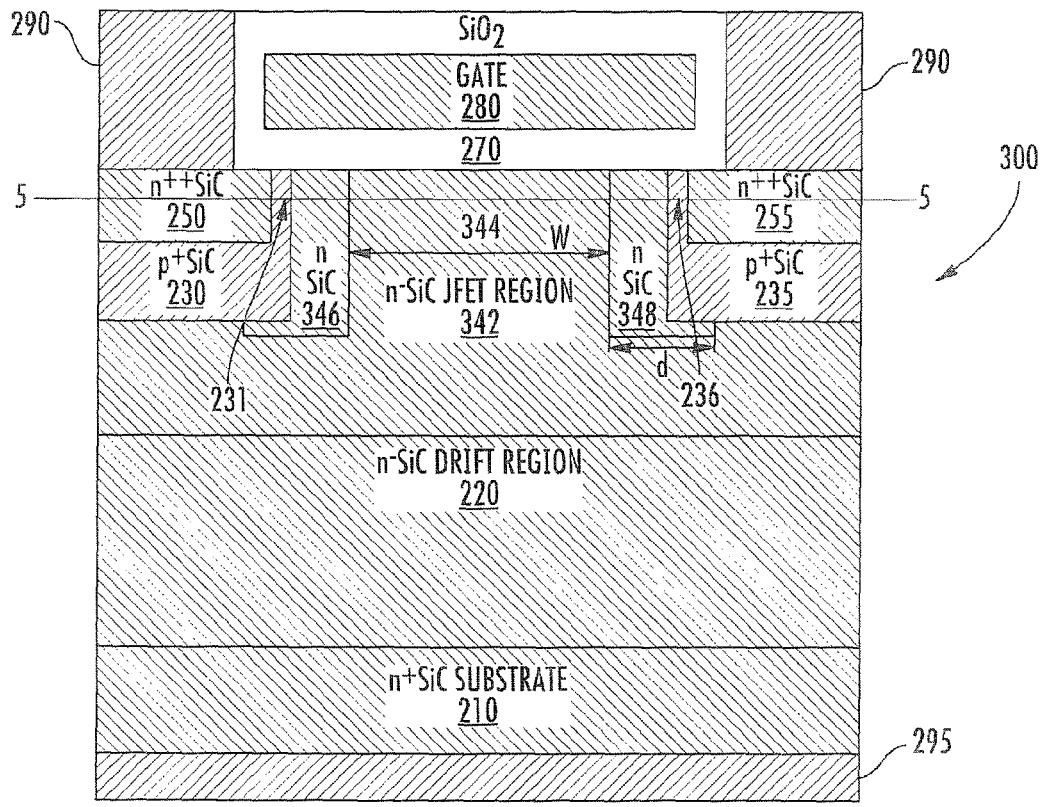
FIG. 3 is a schematic cross-sectional diagram of a power MOSFET according to further embodiments of the present invention.

FIG. 3 is a schematic cross-sectional diagram of a power MOSFET 300 according to further embodiments of the present invention. The MOSFET 300 may be almost identical to the MOSFET 200, described above, and hence elements of the MOSFET 300 that are identical (and identically numbered) to corresponding elements of the MOSFET 200 will not be further described herein. However, as shown in FIG. 3, the MOSFET 300 differs from the MOSFET 200 in that the local JFET regions 346, 348 of MOSFET 300 extend to a depth that exceeds the depth of the p-wells 230, 235 and, as is further shown in FIG. 3, in some embodiments, the local JFET regions 346, 348 may extend partially underneath the p-wells 230, 235. For example, in some embodiments, each local JFET region 346, 348 may extend up to, for example, about 0.2 to 0.3 microns under the respective p-well 230, 235 that it is adjacent to. As shown, in some embodiments the local JFET region 346, 348 may extend laterally to be under both their respective associated p-well 230, 235 and their associated source region 250, 255. It will also be appreciated that the width "W" of the central portion 344 of the JFET region 342 may be varied in further embodiments by expanding or narrowing the widths of the portions of the local JFET regions 346, 348 that are between the p-wells 230, 235.

In the MOSFETs 200 and 300 of FIGS. 2 and 3, the gate insulating layer 270 and the gate electrode 280 are formed directly on the JFET region 242/342. It will be appreciated, however, that in other embodiments, a buried channel region may be provided between the source contacts 290. Such a buried channel region may comprise, for example, a moderately doped n-type silicon carbide layer (e.g., doped to a concentration of $3 \times 10^{16}/cm^3$) that is formed directly under the gate insulating layer 270. The width of this buried channel may be identical to the width of the gate insulating layer 270, and side surfaces of the buried channel may directly contact side surfaces of the ohmic source contacts 290. The buried channel layer may be formed directly on the JFET region 242/342, the local JFET regions 246, 248/346, 348, the p-wells 230, 235 and the n$^+$ silicon carbide source regions 250, 255.

Figure 4:
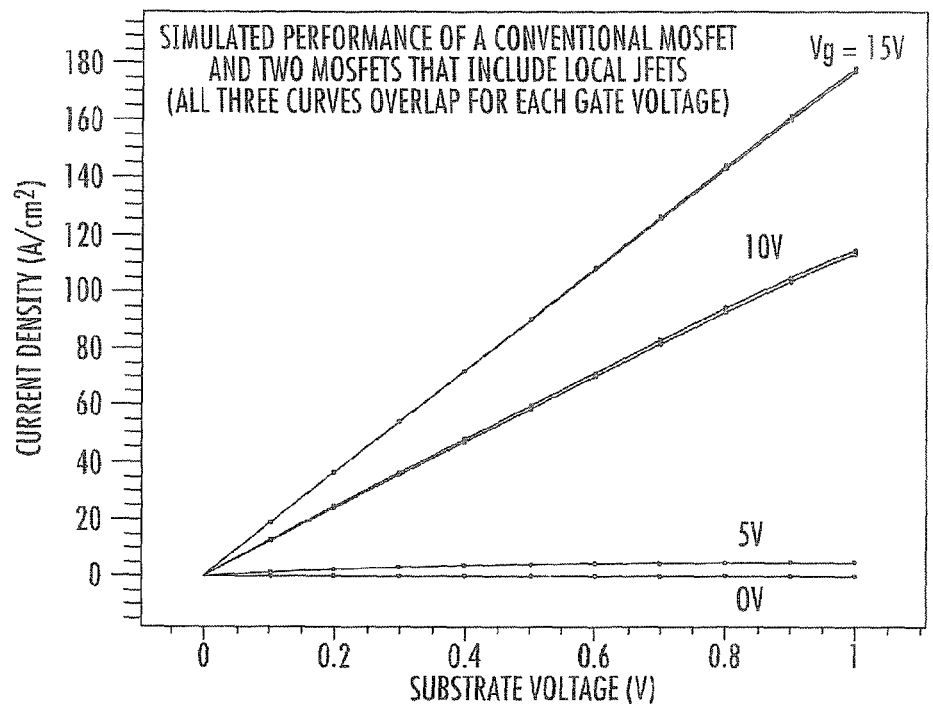
FIG. 4 is a graph showing the simulated output characteristics of a conventional power MOSFET as compared to MOSFETs according to two different embodiments of the present invention.

FIG. 4 is a graph showing the simulated output characteristics of (1) the conventional power MOSFET 100 of FIG. 1 above (except that the current spreading layer 140 was omitted in the device used in the simulation that was used to generate the graph of FIG. 4 so that the JFET region 142 and the p-wells 130, 135 were directly on top of the silicon carbide drift layer 120), (2) the MOSFET 300 of FIG. 3 above, and (3) a MOSFET 300' that is a modified version of the MOSFET 300 of FIG. 3 above that has wider local JFET regions. In particular, FIG. 4 shows the density of the drain-source current ($I_{DS}$) as a function of the voltages applied to the substrate and the gate electrode (with the source contact grounded). In the simulation used to create FIG. 4, the drift regions of all three MOSFETs 100, 300, 300' had a doping concentration of $5 \times 10^{15}$ cm$^{-3}$. The conventional power MOSFET 100 had a JFET region 142 with a doping concentration of $2.75 \times 10^{16}$ cm$^{-3}$. The MOSFET 300 had a JFET region 342 with local JFET regions 346, 348 each having a doping concentration of $5 \times 10^{16}$ cm$^{-3}$ and a central portion 344 having a doping concentration of $5 \times 10^{15}$ cm$^{-3}$. In the MOSFET 300, the local JFET regions 346, 348 each extend under their respective p-wells 330, 335 for a short distance (specifically, the edge of each local JFET region 346, 348 that is under the p-well 230, 235 is vertically aligned with the edge of the source region 250, 255 that is closest to the JFET region 342), and the maximum width of the local JFET regions 346, 348 (width "d" in FIG. 3) was equal to 0.5 microns. The MOSFET 300' had a JFET region with local JFET regions each having a doping concentration of $3 \times 10^{16}$ cm$^{-3}$ and a central portion having a doping concentration of $5 \times 10^{15}$ cm$^{-3}$. In the MOSFET 300', the maximum width of each local JFET region (width "d" in FIG. 3) was equal to 1.0 micron, and each local JFET region extends under its respective p-well for a distance of 0.5 microns. It will be appreciated that, in further embodiments, the local JFET regions could extend under their respective p-wells for the full width of each p-well.

In FIG. 4, the simulated results for each MOSFET 100, 300, 300' so closely match that it appears that only a single curve is plotted for each gate voltage Vg that was simulated. It will thus be understood that each curve in FIG. 4 represents the simulated results for all three MOSFETs 100, 300, 300'. Thus, FIG. 4 shows that the use of local JFET regions as opposed to a conventional JFET region may not result in a sacrifice in the current-voltage characteristics, while providing the various other advantages discussed above.

Figure 5:
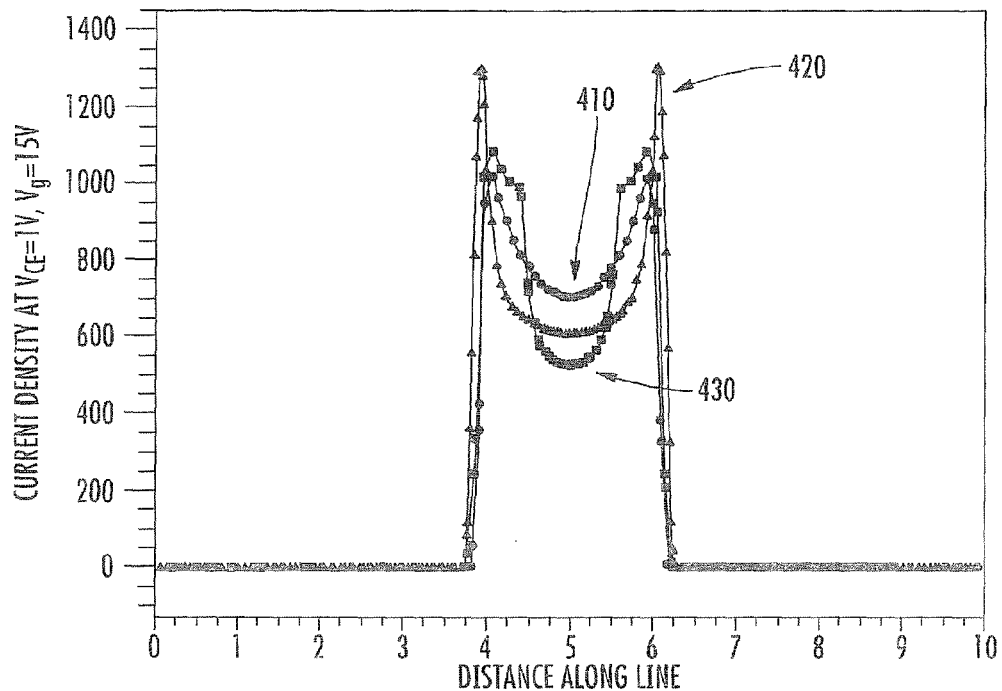
FIG. 5 is a graph showing the simulated current distribution in the JFET region for the conventional power MOSFET and the two MOSFETs according to embodiments of the present invention that were used to generate the graph of FIG. 4.

FIG. 5 is a graph showing the simulated current distribution in the JFET region for the conventional power MOSFET 100 and the MOSFETs 300, 300' that were used to generate the graph of FIG. 4. In particular, FIG. 5 illustrates the current distribution for each of the MOSFETs 100, 300, 300' taken along the lines 5-5 in FIGS. 1 and 3. In FIG. 5, curve 410 illustrates the current distribution of the MOSFET 100, curve 420 illustrates the current distribution of the MOSFET 300, and curve 430 illustrates the current distribution of the MOSFET 300' for a gate voltage ($V_g$) of 15 volts and a source-drain voltage $V_{DS}$ of 1 volt. The value of "5" on the x-axis of the graph of FIG. 5 corresponds to the center of the JFET region for each of the MOSFETs.

As shown in FIG. 5, the conventional MOSFET 100 has a relatively high current density in the central portion of its JFET region 142 (i.e., greater than 700 A/cm$^2$), and has a maximum current density in the channels 131, 136 of about 1050 A/cm$^2$. In contrast, the MOSFET 300 has a reduced current density in the central portion 344 of its JFET region 342 (i.e., as low as about 620 A/cm$^2$), and has higher current densities in the channel regions 231, 236 (i.e., greater than about 1300 A/cm$^2$). The MOSFET 300' has even further reduced current density in the central portion of its JFET region (i.e., less than 600 A/cm$^2$), and has intermediate current densities in the channel regions (i.e., about 1100 A/cm$^2$). Thus, the graph of FIG. 5 shows that the local JFET regions according to embodiments of the present invention can be used to reduce the current density in the central portion of the JFET region while increasing the current density at the edge of the JFET region in the local JFET regions.

Figure 6:
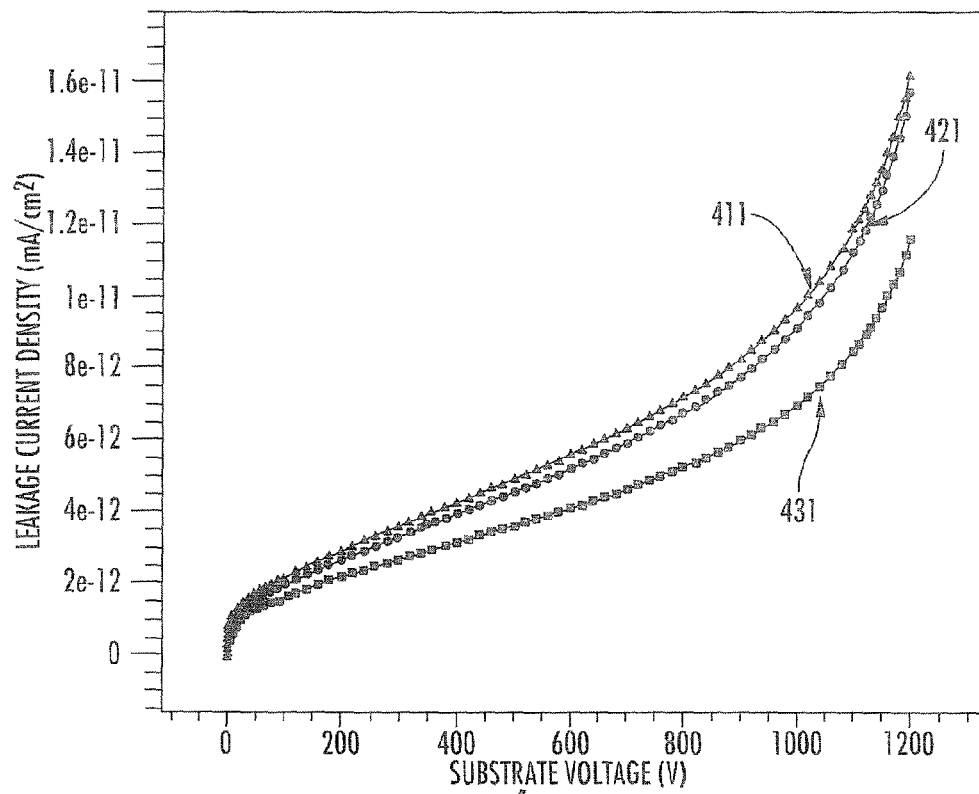
FIG. 6 is a graph showing the simulated reverse current-voltage characteristics for the conventional power MOSFET and two MOSFETs according to embodiments of the present invention that were used to generate the graph of FIG. 4.

FIG. 6 is a graph showing the simulated reverse current-voltage characteristics for the conventional power MOSFET 100 and the power MOSFETs 300, 300' that were used to generate the graph of FIG. 4. In FIG. 6, curve 411 illustrates the simulated reverse current-voltage characteristics for the MOSFET 100, curve 421 illustrates the simulated reverse current-voltage characteristics for the MOSFET 300, and curve 431 illustrates the simulated reverse current-voltage characteristics for the MOSFET 300'. As shown in FIG. 6, the reverse leakage current density for the MOSFETs 300, 300' according to embodiments of the present invention is less than the reverse leakage current for the conventional MOSFET 100 over the full range of blocking voltages. In fact, for MOSFET 300', the reverse leakage current is substantially less over the full range of blocking voltages. Moreover, with respect to the MOSFET 300, FIG. 6 shows that the slope of the reverse leakage current increases more rapidly at high blocking voltages as compared to the conventional MOSFET 100. This shows that when the MOSFET 300 is used in an IGBT it will conduct higher avalanche breakdown currents through the JFET region as compared to a conventional IGBT. As noted above, devices that conduct higher avalanche currents through the JFET region are more likely to survive an avalanche event, as the higher currents help reduce the current that is diverted to the periphery of the device.

Figure 7A:
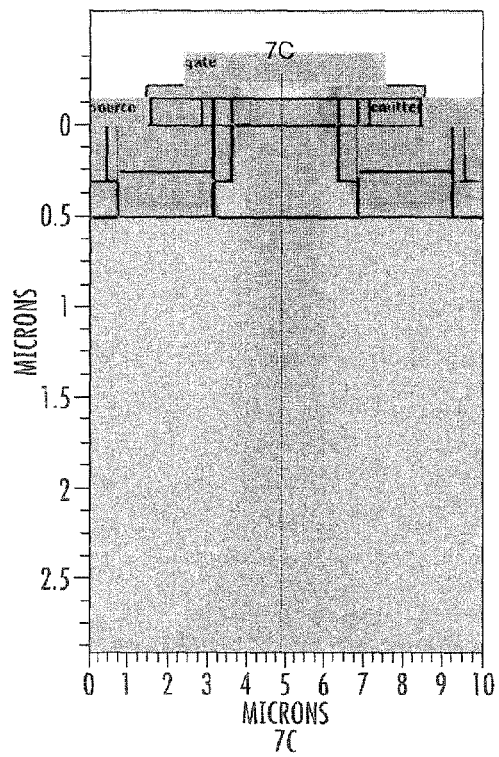
FIGS. 7A and 7B are cross-sectional diagrams that illustrate the simulated electrical field intensity (at a substrate voltage of 1200 volts) for both a conventional power MOSFET and a MOSFET according to embodiments of the present invention.
Figure 7B:
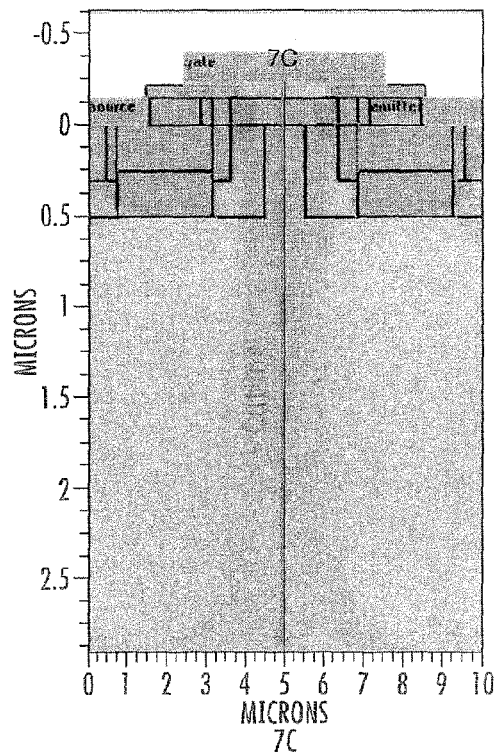

FIGS. 7A and 7B are cross-sectional diagrams that illustrate the electrical field intensity (for a substrate voltage of 1200 volts) for both the conventional power MOSFET 100 and the MOSFET 300 when the devices are in their off-states. As shown in FIGS. 7A and 7B, the electric field in the gate oxide layer 170 of the conventional MOSFET 100 is quite high, while the electric field in the gate oxide layer 270 of the MOSFET 300 is significantly reduced. The electric field throughout the remainder of the devices 100, 300 is relatively similar.

Figure 7C:
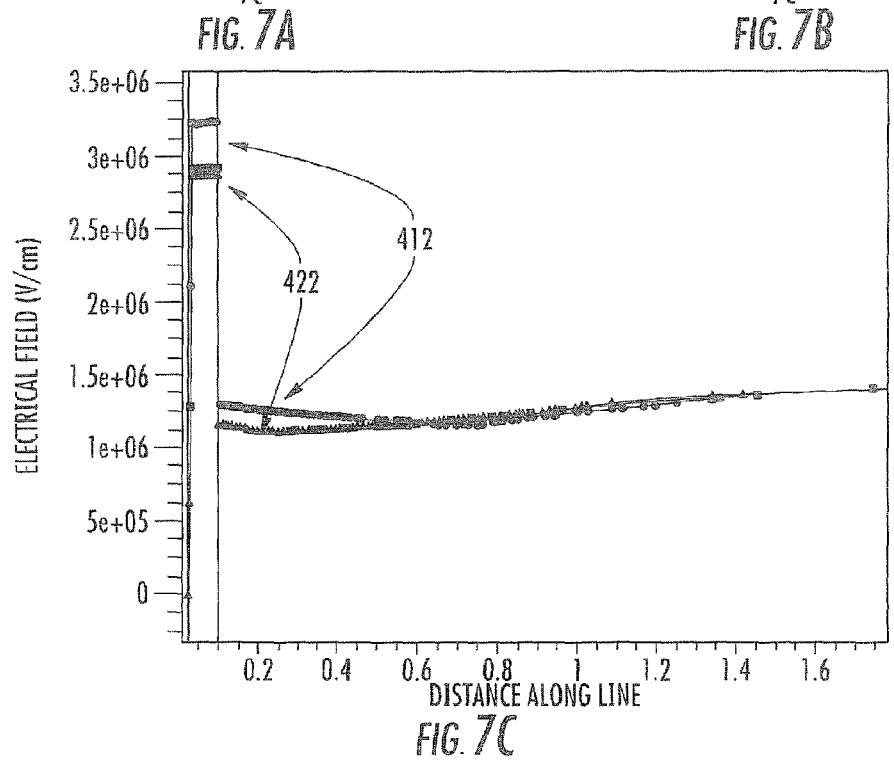
FIG. 7C is a graph illustrating the simulated electrical field values taken along the line 7C-7C of FIG. 7A and the line 7C-7C of FIG. 7B.

FIG. 7C is a graph illustrating the simulated electrical field values taken along the line 7C-7C of FIG. 7A and the line 7C-7C of FIG. 7B. As shown by curve 422 in FIG. 7C, the electric field in the gate oxide layer 270 of MOSFET 300 is reduced to about $2.90 \times 10^6$ volts/cm as compared to about $3.25 \times 10^6$ volts/cm in the gate oxide layer 170 of the conventional MOSFET 100 (curve 412). FIG. 7C also shows that outside the gate oxide region the electric field is similar for both devices.

Figure 8:
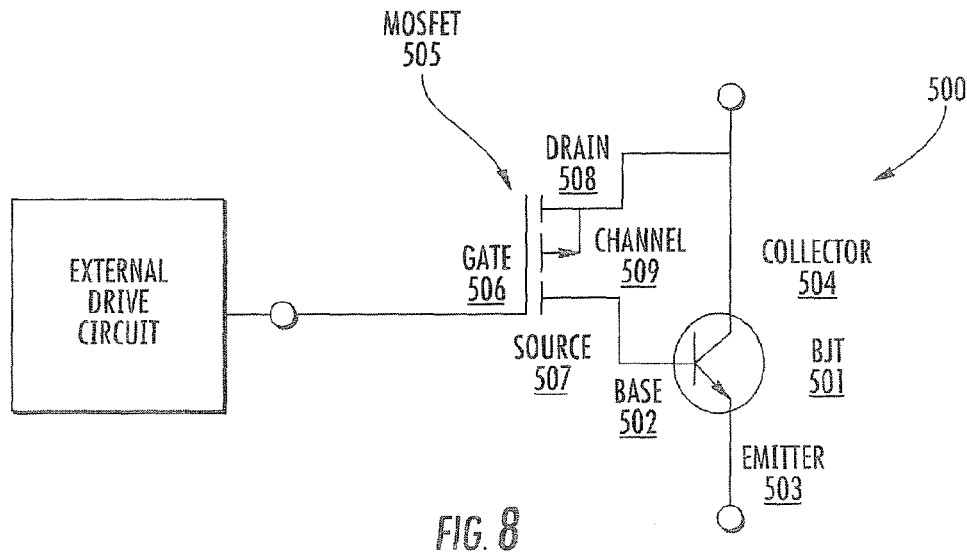
FIG. 8 is a circuit diagram of a power IGBT according to certain embodiments of the present invention.
Figure 9:
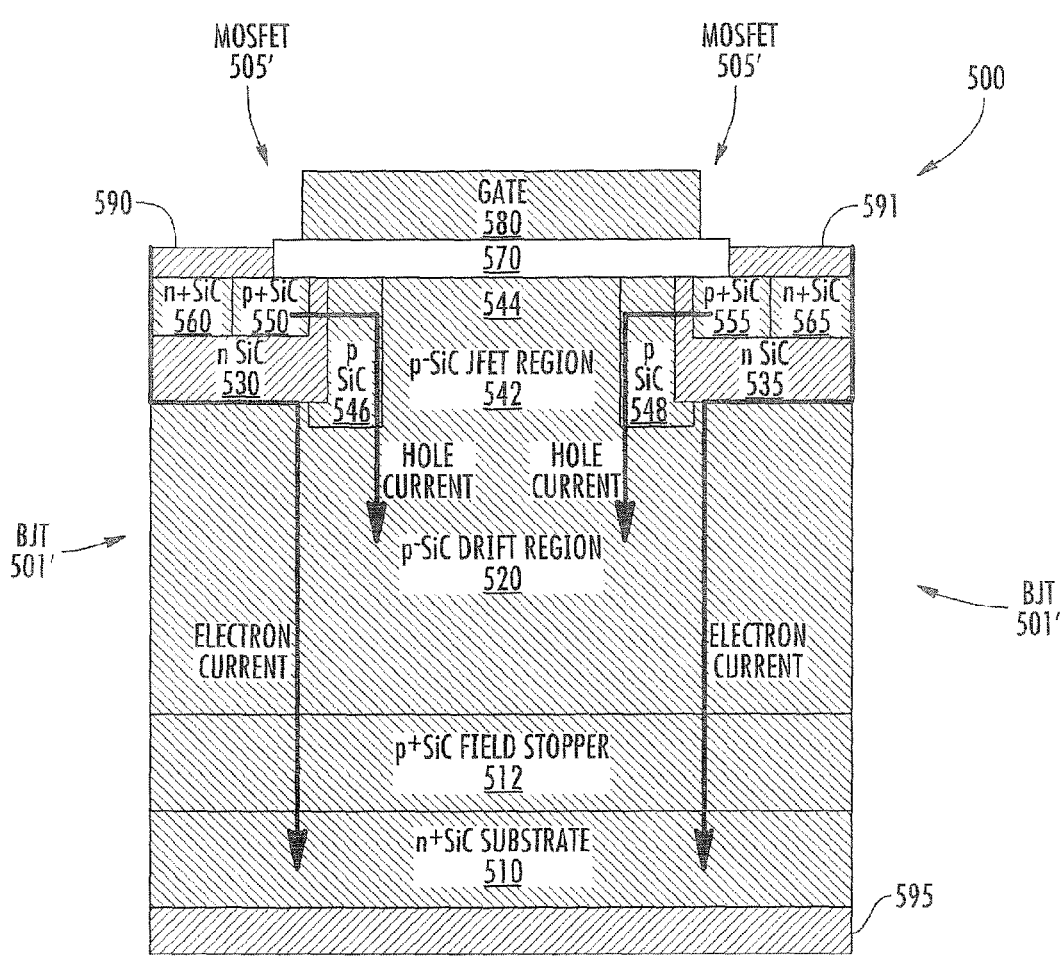
FIG. 9 is a schematic cross-sectional diagram of a power IGBT according to certain embodiments of the present invention.

FIG. 8 is a circuit diagram of a p-channel IGBT 500 according to embodiments of the present invention. FIG. 9 is a cross-sectional diagram of an implementation of a unit cell of the IGBT 500 of FIG. 8.

As shown in FIG. 8, the IGBT 500 includes an NPN silicon carbide power BJT 501 that has a base 502, an emitter 503 and a collector 504. The IGBT 500 further includes a silicon carbide power MOSFET 505 having, a gate 506, a source 507 and a drain 508. The source 507 of the silicon carbide power MOSFET 505 is electrically connected to the base 502 of the silicon carbide power BJT 501, and the drain 508 of the silicon carbide power MOSFET 505 is electrically connected to the collector 504 of the silicon carbide power BJT 501.

The IGBT 500 may operate as follows. An external drive circuit is connected to the gate 506 of the MOSFET 505 for applying a gate bias voltage to the power MOSFET 505. When this external drive circuit applies a sufficient voltage to the gate electrode 506, an inversion layer is formed under the gate 506 which acts as a channel 509 that electrically connects the collector 504 of BJT 501 to the base 502 of BJT 501. Holes are conducted from the collector region 504 through the channel 509 into the base 501. This hole current acts as the base current that drives the BJT 501. In response to this hole current, electrons are conducted from the emitter 503 of BJT 501 across the base 502 to the collector 504 of BJT 501. Thus, the silicon carbide power MOSFET 505 converts the silicon carbide power BJT 501 from a current driven device to a voltage driven device, which may allow for a simplified external drive circuit. The silicon carbide power MOSFET 505 acts as a driver transistor, and the silicon carbide power BJT 501 acts as the output transistor of the IGBT 500.

FIG. 9 is a schematic cross-sectional diagram of (a) two individual MOSFETs 505' that are used to form at least part of the power MOSFET 505 of FIG. 8 and (b) two individual BJTs 501' that are used to form at least part of the power BJT 501 of FIG. 8. It will be appreciated that to form the power IGBT 500, the plurality of individual MOSFETs 505' would be implemented in parallel and the plurality of the individual BJTs 501' would be implemented in parallel. In some embodiments, the individual MOSFETs 505' may be spatially separated from the individual. BJTs 501' while, in other embodiments, the individual MOSFETs 505' and the individual BJTs 501' may be intermixed throughout the device. In either case, the combination of an individual MOSFET 505' and an individual BJT 501' may functionally be viewed as a unit cell of the IGBT 500.

As shown in FIG. 9, the MOSFETs 505' and the BJTs 501' may be formed on the same bulk single crystal n-type silicon carbide substrate 510. A p$^+$ silicon carbide field stopper layer 512 may be provided on the substrate 510. The p-type field stopper layer 512 may be epitaxially grown and may be, for example, about 0.2 microns thick, and may be doped to a concentration of about $5 \times 10^{17}$ cm$^{-3}$. A lightly doped (p$^-$) p-type silicon carbide drift layer 520 is provided on the field stopper layer 512. The p-type drift layer 520 may be, for example, a 100 micrometer (μm) thick epitaxial layer doped at a concentration of about $2 \times 10^{14}$ cm$^{-3}$. A pair of silicon carbide n-wells 530, 535 are provided in an upper surface of the p-type silicon carbide drift layer 520. A p$^+$ silicon carbide source region 550 is formed in a central portion of the n-well 530, and a p$^+$ silicon carbide source region 555 is formed in a central portion of the n-well 535. A heavily-doped n$^+$ silicon carbide region 560 is formed in the upper portion of n-well 530 adjacent the p$^+$ silicon carbide region 550, and a heavily-doped n$^+$ silicon carbide region 565 is formed in the upper portion of n-well 535 adjacent the p$^+$ silicon carbide region 555. The combination of the p$^+$ silicon carbide source region 550 and the heavily-doped n$^+$ silicon carbide layer 560 comprise an anode of a first of the IGBTs of the unit cell, and the combination of the p$^+$ silicon carbide source region 555 and the heavily-doped n$^+$ silicon carbide layer 565 comprise an anode of the second of the IGBTs of the unit cell.

The upper portion of the p-type silicon carbide drift layer 520 between the n-wells 530, 535 comprises a p-type JFET region 542. The JFET region 542 includes a central portion 544 and two local JFET regions 546, 548 that are adjacent to the respective n-wells 530, 535. The local JFET regions 546, 548 of the JFET region 542 may have a first doping concentration that is greater than a second doping concentration of the central portion 544 of the JFET region 542. An ohmic contact 590 is formed to contact the n$^+$ silicon carbide region 560 and the p$^+$ silicon carbide region 550, and an ohmic contact 591 is formed to contact the n$^+$ silicon carbide region 565 and the p$^+$ silicon carbide region 555. An ohmic contact 595 is formed on the back side of the n$^+$ silicon carbide substrate 510. A gate insulating layer 570 such as a silicon dioxide layer is formed over the p$^-$ JFET region 542, a top portion of the n-wells 530, 535 and onto the p$^+$ silicon carbide emitter regions 550, 555. Finally, a MOSFET gate 580 such as, for example, a silicon carbide layer is formed on the gate insulating layer 570. MOSFET channels are thereby defined in the n-wells 530, 535 between the p$^+$ emitter regions 550, 555 and the p-type JFET region 542.

The n$^+$ silicon carbide regions 560, 565 act as the collectors 504' of the BJTs 501'. The p-type silicon carbide layers 512, 520, 542 act as the base 502' of the BJT 501', and the n$^+$ silicon carbide substrate 510 acts as the emitter 503' of the BJTs 501'. The p$^+$ silicon carbide regions 550, 555 act as the drain 508' of the respective MOSFETs 505', and the p-type JFET region 542, 546, 548 acts as the source 507' of the MOSFETS 505'. The hole current and the electron current through the IGBT 500 is also illustrated in FIG. 9.

The inclusion of the local JFET regions 546, 548 in the IGBT 500 may provide a number of advantages. First, as noted above, the reduced doping concentration in the central portion of the JFET region 542 may reduce the electric field in the gate oxide layer 570 when the IGBT 500 is in its off-state. Additionally, the depletion regions of the MOSFETs 505' on opposite sides of the JFET region 542 may tend to merge under the JFET region 542 and may extend further from the gate, which may reduce the reverse leakage current and enhance the voltage blocking capabilities of the IGBT 500 as compared to conventional devices.

Additionally, as shown in FIG. 9, the local JFET regions 546, 548 may partially underlie the p-wells 230, 235. As a result, the p-n junction between the p⁻ drift layer 520 and the n-wells 530, 535 may more easily experience avalanche breakdown, as the higher doping levels in the portions of the local JFET regions 546, 548 that partially underlie the n-wells 530, 535 results in a higher electric field, which facilitates reaching avalanche conditions within the active area of the device more quickly. This may be advantageous because it may increase the avalanche current through the n-wells 530, 535, which, in turn, may decrease the avalanche current at the periphery of the IGBT 500. As excessive avalanche current at the periphery can physically damage or destroy the IGBT 500, the increased avalanche current provided through the n-wells 530, 535 may provide a more robust device that is more likely to survive an avalanche event.

Additionally, the by extending the local JFET regions 546, 548 to partially underlie the n-wells 530, 535 it may be possible to reduce the current gain of the BJT 501, thereby reducing the ratio of the electron current flow to hole current flow through the device. Thus, as compared to a conventional IGBT, the IGBTs according to embodiments of the present invention may have relatively higher hole current levels (which current flows through the JFET region of the device) and relatively lower electron current levels (which is the current that can cause latch-up of a p-channel IGBT such as IGBT 500. Thus, the IGBTs according to embodiments of the present invention may be less susceptible to latch-up.

While FIGS. 8 and 9 illustrate the structure of a unit cell 500' of a p-channel IGBT 500 according to embodiments of the present invention, it will be appreciated that n-channel IGBTs may be provided pursuant to further embodiments of the present invention. For example, in one such embodiment, a unit cell of an n-channel IGBT may be provided that has the same structure as shown in FIG. 9, except that the polarity of each of the semiconductor layers is reversed. It will likewise be appreciated that both n-type and p-type MOSFETs may be provided that have the local JFET regions according to embodiments of the present invention.

Pursuant to further embodiments of the present invention, methods of forming power field effect transistors having selectively doped JFET regions are provided, as well as methods of forming devices that include such transistors. For example FIGS. 10A-10F illustrate a method for forming a JFET region of an n-channel MOSFET according to some embodiments of the present invention.

Figure 10A:
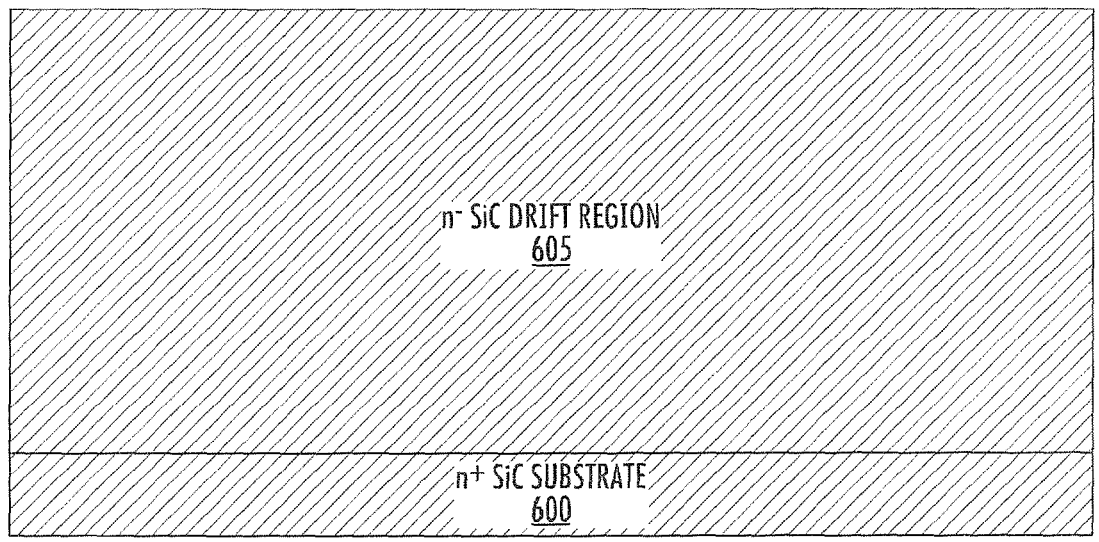
FIGS. 10A-10F are schematic cross-sectional diagrams illustrating a method of forming a MOSFET that includes local JFET regions according to certain embodiments of the present invention.
Figure 10B:
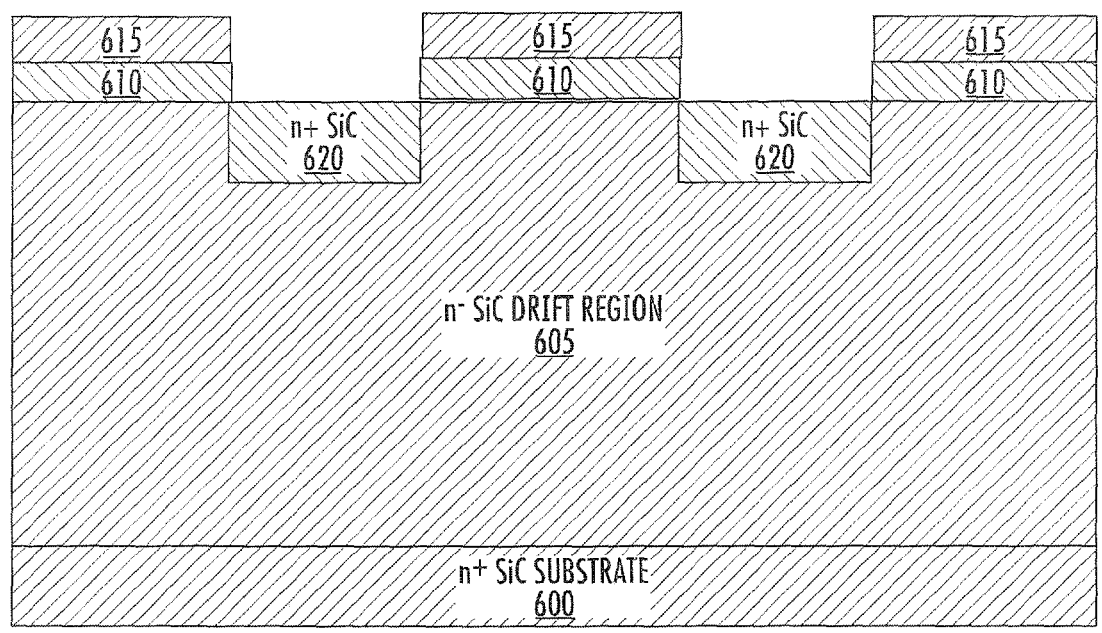

As shown in FIG. 10A, operations may begin with the formation of a lightly-doped n-type silicon carbide drift region 605 on an n-type silicon carbide substrate 600 (which may be doped, for example, at a concentration of $5\times10^{15}/cm^3$) Next, with reference to FIG. 10B, a first mask layer 610 such as an oxide mask layer (e.g. silicon dioxide) and a second mask layer 615 such as a photoresist, a polysilicon layer or a nitride layer (e.g., silicon nitride) may be sequentially formed on an upper surface of the silicon carbide drift layer 605. As shown in FIG. 10B, the second mask layer 615 and the first mask layer 610 may be sequentially etched to expose portions of the n-type silicon carbide drift region 605. An ion implantation process using n-type dopants may then be performed through the openings in the first and second mask layers to form first and second heavily-doped n-type source/drain regions 620, 625 in an upper surface of the n-type silicon carbide drift region 605.

Figure 10C:
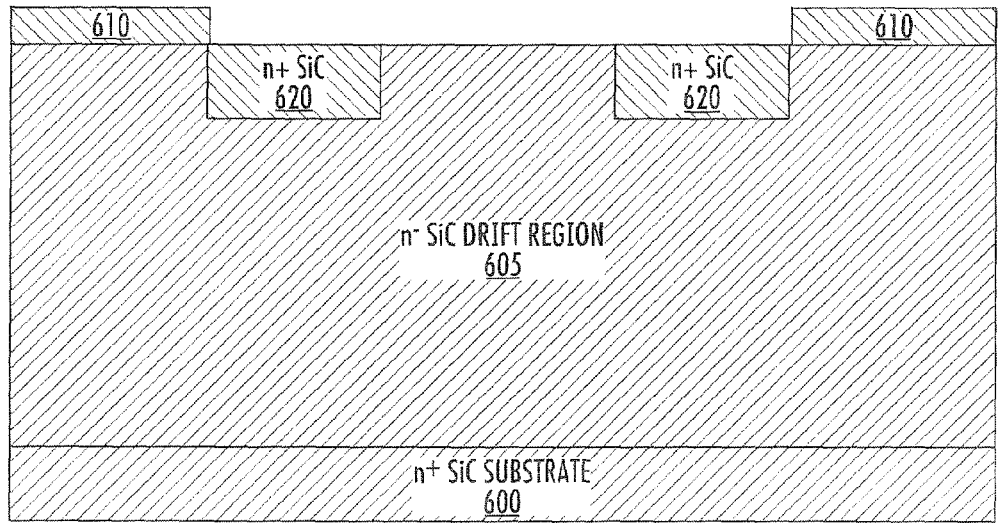
Figure 10D:
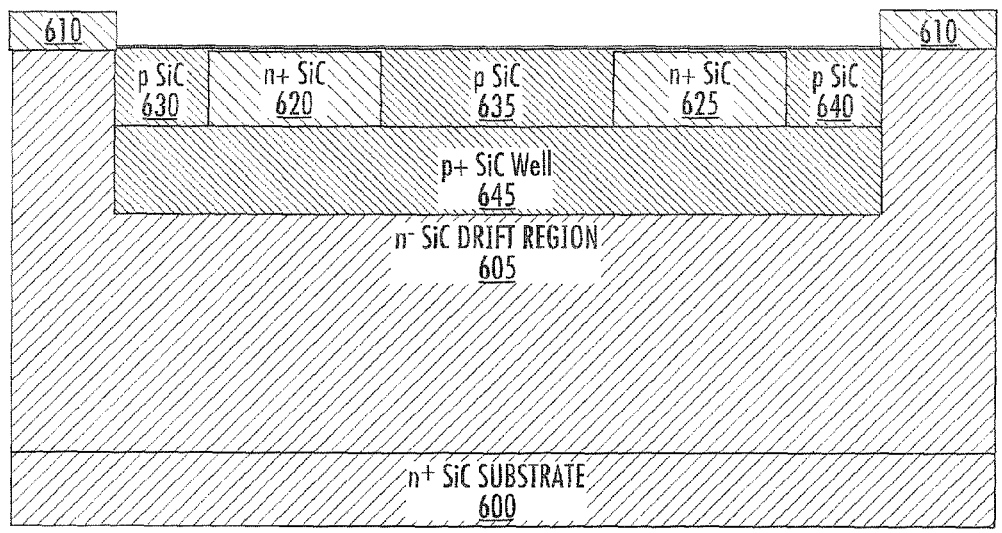

As shown in FIG. 10C, the second mask 615 may then be removed using, for example, a dry or wet etching process (depending upon the material used to form the second mask layer), and portions of the first oxide layer 610 may then be selectively removed using, for example, a buffered oxide etching process, to expose further portions of the top surface of the drift layer 605. Then, as shown in FIG. 10D, a second ion implantation process may be performed to implant p-type dopants in the exposed upper surface of the n-type silicon carbide drift region 605. The second ion implantation process may be set to implant the p-type dopants to a deeper depth than the first ion implantation process discussed above. As a result, moderately to heavily-doped p-type regions 630, 635, 640 may be formed in upper portions of the n-type silicon carbide drift region 605 that are adjacent the first and second source/drain regions 620, 625, and a heavily to very heavily-doped p-type region 645 may be formed in a portion of the n-type silicon carbide drift region 605 that is under the first and second source/drain regions 620, 625 and the p-type regions 630, 635, 640. The regions 630, 635, 640, 645 comprise a p-type well region 650 of the MOSFET. The first and second source/drain regions 620, 625 may doped sufficiently heavily n-type that even after the second ion implantation process using p-type dopants these regions may remain heavily-doped n-type regions 620, 625.

Figure 10E:
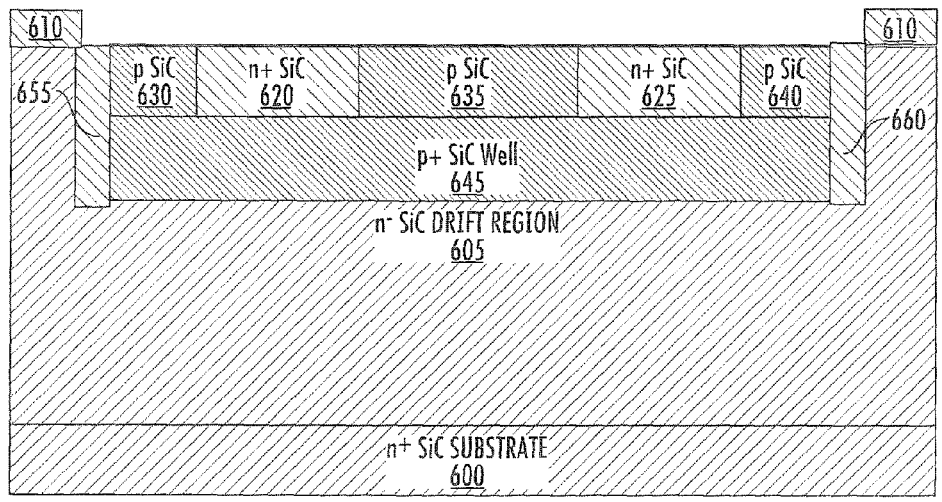
Figure 10F:
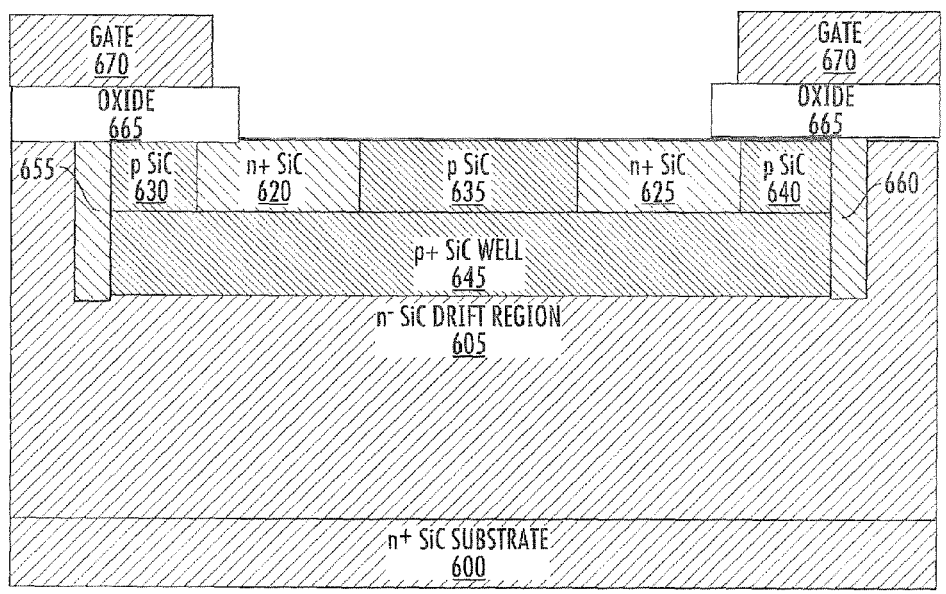

Next, as shown in FIG. 10E, a second buffered oxide etch (or other mask removal process) may be used to selectively remove additional portions of the first mask layer 610, thereby exposing additional portions of the n-type silicon carbide drift region 605 that are adjacent the side edges of the p-well 650. A third ion implantation process using n-type dopants may be performed into the exposed portion of the upper surface of the n-type silicon carbide drift region 605 through the opening in the first mask layer 610. This third ion implantation process may be used to form first and second moderately-doped local JFET regions 655, 660 adjacent the side edges of the p-well 650. The local JFET regions may be doped n-type to a concentration of, for example, $2.75\times10^{16}/cm^3$. Next, as shown in FIG. 10F, the remaining portions of the first mask layer 610 may be removed and a gate insulation layer 665 such as, for example, a silicon dioxide layer and a gate electrode 670 may be sequentially formed on the upper surface of the device to complete the MOSFET.

As shown in FIGS. 10A-10F, the JFET region and local JFET region implants may be performed using self-alignment techniques, and consequently the MOSFET may be formed without the need to pattern the JFET region. Additionally, a single photoresist (or other mask) may be deposited (i.e., first and second mask layers 610, 615) that are used for the first, second and third ion implantation processes discussed above. Additionally, in some embodiments, a retrograde implantation profile may be used during the third ion implantation process discussed above in order to more heavily dope the lower portions of the local JFET regions 655, 660 as compared to the upper portions. This retrograde implantation profile may be used to better control the threshold voltage of the MOSFET. It will also be appreciated that while FIGS. 10A-10F illustrate one of way of forming a MOSFET according to embodiments of the present invention, many other methods could be used. Finally, while FIGS. 10A-10F illustrate a method of forming a MOSFET according, to embodiments of the present invention, it will be appreciated that the operations disclosed therein may be suitably modified to form other devices such as, for example, the IGBT 500 of FIGS. 8-9.

While embodiments of the above invention are primarily described with respect to MOSFETs and IGBTs, it will be appreciated that the local JFET regions according to embodiments of the present invention may be used in other devices.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor switching device, comprising:
   a wide band-gap drift layer having a first conductivity type;
   a first wide band-gap well region having a second conductivity type that is opposite the first conductivity type on the wide band-gap drift layer;
   a second wide band-gap well region having the second conductivity type on the wide band-gap drift layer;
   a first wide band-gap source/drain region having the first conductivity type on the first wide band-gap well region;
   a second wide band-gap source/drain region having the first conductivity type on the second wide band-gap well region;
   a wide band-gap JFET region having the first conductivity type between the first and second well regions; and
   a gate insulation layer on the JFET region and on the first and second well regions,
   wherein a first local JFET region of the JFET region that is adjacent a side surface of the first well region and a second local JFET region of the JFET region that is adjacent a side surface of the second well region have doping concentrations that exceed a doping concentration of a central portion of the JFET region that is between the first and second local JFET regions of the JFET region,
   wherein the portions of the gate insulation layer that are on the first local JFET region, the central portion of the JFET region and the second local JFET region all have substantially the same thickness.

2. The semiconductor switching device of claim 1, wherein the first and second local JFET regions of the JFET region extend at least partially underneath the first and second wide band-gap well regions, respectively.

3. The semiconductor switching device of claim 2, further comprising a gate electrode on the gate insulation layer.

4. The semiconductor switching device of claim 3, wherein the device comprises a silicon carbide MOSFET.

5. The semiconductor switching device of claim 4, wherein the wide band-gap drift layer comprises an n-type silicon carbide drift layer, wherein the first and second wide band-gap well regions comprise first and second p-type silicon carbide p-wells, wherein the first and second wide band-gap source/drain regions comprise first and second n-type silicon carbide source/drain regions, and wherein the wide band gap JFET region comprises an n-type silicon carbide JFET region.

6. The semiconductor switching device of claim 1, wherein a peak doping concentration of each of the first and second local JFET regions exceeds the doping concentration at the central portion the JFET region by at least a factor of three.

7. The semiconductor switching device of claim 2, wherein the first local JFET region of the JFET region also extends at least partially underneath the first wide band-gap source/drain region and the second local JFET region of the JFET region also extends at least partially underneath the second wide band-gap source/drain region.

8. The semiconductor switching device of claim 1, wherein the device comprises a silicon carbide insulated gate bipolar junction transistor ("IGBT").

9. The semiconductor switching device of claim 8, wherein the device further comprises an n-type silicon carbide substrate and first and second n+silicon carbide emitter regions formed in the first and second wide band-gap well regions, respectively, and wherein the wide band-gap drift layer comprises a p-type silicon carbide drift layer, wherein the first and second wide band-gap well regions comprise first and second n-type silicon carbide n-wells, wherein the first and second wide band-gap source/drain regions comprise first and second p-type silicon carbide source/drain regions, and wherein the wide band gap JFET region comprises a p-type silicon carbide JFET region.

10. The semiconductor switching device of claim 9, wherein the device further comprises a p-type silicon carbide current spreading layer, wherein the p-type silicon carbide JFET region is part of the p-type silicon carbide current spreading layer, and wherein the first and second local JFET regions comprise implanted portions of the p-type silicon carbide current spreading layer.

11. An insulated gate bipolar junction transistor ("IGBT"), comprising:
    a wide band-gap drift layer having a first conductivity type on a wide band-gap substrate having a second conductivity type that is opposite the first conductivity type;
    a first wide band-gap well region having the second conductivity type on the wide band-gap drift layer;
    a second wide band-gap well region having the second conductivity type on the wide band-gap drift layer;
    a first wide band-gap source/drain region having the first conductivity type on the first wide band-gap well region;
    a second wide band-gap source/drain region having the first conductivity type on the second wide band-gap well region;
    a first wide band-gap collector region having the second conductivity type on the first wide band-gap well region;
    a second wide band-gap collector region having the second conductivity type on the second wide band-gap well region;
    a wide band-gap JFET region having the first conductivity type between the first and second well regions;
    wherein a first local JFET region of the JFET region that is adjacent a side surface of the first well region and a second local JFET region of the JFET region that is adjacent a side surface of the second well region have doping concentrations that exceed a doping concentration of a central portion of the JFET region that is between the first and second local JFET regions of the JFET region, and
    wherein a lower portion of the first local JFET that is adjacent the wide band-gap drift layer is more heavily doped than an upper portion of the first local JFET that is adjacent the gate insulation layer.

12. The IGBT of claim 11, wherein the first and second local JFET regions of the JFET region extend at least partially underneath the first and second wide band-gap well regions, respectively.

13. The IGBT of claim 12, further comprising a gate insulation layer on the wide band-gap JFET region and the first and second wide band-gap well regions, and a gate electrode on the gate insulation layer, wherein the portions of the gate insulation layer that are on the first local JFET region, the central portion of the JFET region and the second local JFET region all have substantially the same thickness.

14. The IGBT of claim 12, wherein the first local JFET region of the JFET region also extends at least partially underneath the first wide band-gap source/drain region and the second local JFET region of the JFET region also extends at least partially underneath the second wide band-gap source/drain region.

15. The IGBT of claim 11, wherein the first conductivity type is p-type and the second conductivity type is n-type.

16. A semiconductor switching device, comprising:
   a wide band-gap drift layer having a first conductivity type;
   a first wide band-gap well region having a second conductivity type that is opposite the first conductivity type on the wide band-gap drift layer;
   a second wide band-gap well region having the second conductivity type on the wide band-gap drift layer; and
   a wide band-gap JFET region having the first conductivity type between the first and second well regions;
   wherein the wide band-gap JFET region includes a middle portion that has a doping concentration that is lower than a doping concentration of an outer portion of the wide band-gap JFET region, and
   wherein a lower surface of the first JFET region is at least as close to a lower surface of the wide band-gap drift layer as is a lower surface of the first wide band-gap well region, and wherein a lower surface of the second JFET region is at least as close to the lower surface of the wide band-gap drift layer as is a lower surface of the second wide band-gap well region.

17. The switching device of claim 16, wherein the outer portion of the wide band-gap JFET region extends at least partially underneath the first wide band-gap well region.

18. The switching device of claim 17, wherein a peak doping concentration of the outer portion of the wide band-gap JFET region exceeds the doping concentration at the middle portion the JFET region by at least a factor of three.

19. The semiconductor switching device of claim 1, wherein a lower surface of the first JFET region is at least as close to a lower surface of the wide band-gap drift region as is a lower surface of the first wide band-gap well region, and wherein a lower surface of the second JFET region is at least as close to a lower surface of the wide band-gap drift region as is a lower surface of the second wide band-gap well region.

20. The semiconductor switching device of claim 1, wherein a lower portion of the first local JFET that is adjacent the wide band-gap drift layer is more heavily doped than an upper portion of the first local JFET that is adjacent the gate insulation layer.

* * * * *

UNITED STATES PATENT AND TRADEMARK OFFICE
CERTIFICATE OF CORRECTION

PATENT NO.       : 8,563,986 B2                                Page 1 of 1
APPLICATION NO.  : 12/611165
DATED            : October 22, 2013
INVENTOR(S)      : Zhang It is certified that error appears in the above-identified patent and that said Letters Patent is hereby corrected as shown below:

In the Specification:
Column 9, Line 56:

Please correct "substrate 210. Then silicon carbide drift"
        to read -- substrate 210. The n⁻ silicon carbide drift --

Signed and Sealed this
Twenty-seventh Day of May, 2014

Michelle K. Lee
*Deputy Director of the United States Patent and Trademark Office*